(12) United States Patent
Enjalbert et al.

(10) Patent No.: US 7,935,562 B2
(45) Date of Patent: May 3, 2011

(54) METHOD FOR ANNEALING PHOTOVOLTAIC CELLS

(75) Inventors: Nicolas Enjalbert, Les Avenirs (FR);
Sébastein Dubois, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 242 days.

(21) Appl. No.: 11/845,841

(22) Filed: Aug. 28, 2007

(65) Prior Publication Data

US 2008/0075840 A1    Mar. 27, 2008

(30) Foreign Application Priority Data

Sep. 21, 2006    (FR) .................................. 06 53882

(51) Int. Cl.
*H01L 21/00* (2006.01)
*H01L 31/00* (2006.01)

(52) U.S. Cl. ............... 438/72; 438/69; 438/70; 136/256

(58) Field of Classification Search .................... 438/72, 438/98; 257/431, 432, 437, E31.093
See application file for complete search history.

(56) References Cited

U.S. PATENT DOCUMENTS

| | | | | |
|---|---|---|---|---|
| 2,787,564 | A * | 4/1957 | Shockley | 257/565 |
| 4,577,393 | A | 3/1986 | Schmidt | |
| 7,436,044 | B2 * | 10/2008 | Khan et al. | 257/529 |
| 2005/0189015 | A1 | 9/2005 | Rohatgi et al. | |
| 2008/0001139 | A1 * | 1/2008 | Augusto | 257/13 |

OTHER PUBLICATIONS

Quirk et al., Semicondcutor Manufacturing Technology, Nov. 2000, Prentice Hall, Upper Saddle River, NJ., p. 246.*
S.K Dhungel et al.; "Effect of Pressure on Surface Passivation of Silicon Solar Cell by Forming Gas Annealing"; Materials Science in Semiconductor Processing, Elsevier Science Publishers B.V.; Banking, UK, vol. 7 n° 4-6, pp. 427 to 431, Oct. 22, 2004.
S. Martinuzzi et al.; "N-Type Multicrystalline Silicon for Solar Cells", 20th EPSEC, 2005, Barcelona, pp. 631 to 634.
D.S. Kim et al.; "Ribbon Si Solar Cells with Efficiencies over 18% by Hydrogenation of Defects", Solar Energy Materials & Solar Cells, vol. 90, pp. 1227 to 1240, 2006.
S. Marinuzzi et al.; "Hydrogen Passivation of Defects in Multicrystalline Silicon Solar Cells"; Solar Energy Materials & Solar Cells, vol. 80, pp. 343 to 353, 2003.
Nijs J. F.; "Advanced Manufacturing Concepts for Crystalline Silicon Solar Cells" IEEE Transaction on Electron Devices, IEEE Service Center, Pisacataway, NJ; vol. 46, No. 10, Oct. 1999; pp. 1948-1969.

(Continued)

*Primary Examiner* — Michael S Lebentritt
*Assistant Examiner* — Karen M Kusumakar
(74) *Attorney, Agent, or Firm* — Pearne & Gordon LLP

(57) ABSTRACT

Method for annealing at least one photovoltaic cell comprising a substrate based on silicon with a first type of conductivity, a layer doped with a second type of conductivity produced in the substrate and forming a front face of the substrate, an antireflection layer produced on the front face of the substrate and forming a front face of the photovoltaic cell, at least one metallization on the front face of the cell and at least on metallization on a rear face of the substrate. This method comprises at least the steps of:
a) a first annealing of the photovoltaic cell at a temperature between around 700° C. and 900° C.,
b) a second annealing of the photovoltaic cell at a temperature between around 200° C. and 500° C., at ambient pressure and in ambient air,
with hydrogen being diffused in the substrate during the process.

16 Claims, 3 Drawing Sheets

OTHER PUBLICATIONS

Sana P. et al; "The effect of aluminum treatment and forming gas anneal on EFG silicon solar cells"; Proceedings of the Photovoltaic Specialists Conference; Louisville, May 10-14, 1993, New York, IEEE; vol. conf. 23, May 10, 1993; pp. 111-116.

Okamoto S. et al. "23.5 % efficient silicon solar cell with rear micro contacts of c-Si spl mu/c-Si:H heterostructure"; Conference Record of the 26th IEEE Photovoltiac Specialists Conference, Sep. 29, 1997, pp. 255-258.

French Search Report Dated May 15, 2007.

Evaluation of Conversion Efficiency Gain Provided by the Metallization Method According to Claim 1; Ribeyron, et al., May 28, 2010.

Influence of Substitutional Metallic Impurities on the Performances of p-type Crystalline Silicon Solar Cells: The Case of Gold; Journal of Applied Physics, Dubois, et al.; Dec. 18, 2006.

Hydrogenation of Si from SiNx (H) films: Characterization of H introduced into the Si; Applied Physics Letters; Fan Jiang et al., Aug. 4, 2003.

* cited by examiner

METHOD FOR ANNEALING PHOTOVOLTAIC CELLS

TECHNICAL FIELD AND PRIOR ART

This invention relates to the field of photovoltaic cells and more specifically a method for annealing photovoltaic cells.

A standard method used for the industrial production of a photovoltaic cell 20 based on P- or N-type crystalline (monocrystalline or multicrystalline) silicon is shown in FIGS. 1A to 1E. An N- or a P-type substrate 2 first undergoes a texturisation of its surfaces by use of a potassium hydroxide solution, making it possible to reduce the reflectivity of these surfaces and thus obtain a better optical confinement of the beams entering the substrate 2. An N+ type layer 4 is formed in the substrate 2 by diffusion of phosphorus at the level of all of the faces of the substrate 2 (FIG. 1A). An antireflection layer 6 of hydrogen-rich silicon nitride (SiN—H) is then deposited on the N+ layer 4 by plasma-enhanced chemical vapour deposition (PECVD), as shown in FIG. 1B, forming a front face 8 of the photovoltaic cell 20. Silver 10 and aluminum 12 metallizations are formed by serigraphy respectively on the front face 8 and on the rear face of the substrate 2 (FIG. 1C). Finally, these metallizations 10, 12 undergo an annealing operation in an infrared passage furnace, forming contacts 14 between the front metallizations 10 and the N+ layer 4, as well as a layer 16 based on aluminum and silicon alloy, and a P+ type layer 18 in the substrate 2, replacing a portion of the N+ layer 4 under the rear metallization 12.

Finally, as shown in FIG. 1E, the portions of the N+ layer 4 connecting the layer 18 to the contacts 14, i.e. electrically connecting the metallizations 10 of the front face to the metallization layer 12 of the rear face, are removed. In FIG. 1E, all of the elements of the photovoltaic cell 20 located on the external side of planes AA and BB are removed, for example by laser, plasma, coating or any other etching means.

In the case of a P-type substrate 2, the remaining portion of the N+ layer 4 and the substrate 2 form the PN junction of the photovoltaic cell 20. The P+ layer 18 enables the passivation of the rear face of the substrate 2 by a back-surface field effect (BSF) pushing minority carriers, in this case electrons, into the substrate 2. In the case of an N-type substrate 2, it is the P+ layer 18 and the substrate 2 that form the PN junction of the photovoltaic cell 20, and the N+ layer 4 performs the passivation of the front face of the substrate 2 by a front-surface field effect (FSF) pushing the minority carriers, in this case holes, into the substrate 2, with the antireflection layer 6 also contributing to this passivation. The document "N-type multicrystalline silicon for solar cells" of S. Martinuzzi et al, 20th EPSEC, 2005, Barcelona, pages 631 to 634, describes such a photovoltaic cell, with the annealing temperature described being between 850° C. and 900° C.

In the annealing operation, hydrogen migrates in the form of ions from the hydrogen-rich antireflection layer 6 over several micrometers before forming molecular hydrogen $H_2$ of which the diffusion is limited in the silicon of the substrate 2, and which does not have the property, as the hydrogen ions do, of passivating the crystallographic defects and the impurities. However, in the formation of the alloy layer 16, gaps migrate in the substrate 2 and enable the dissociation of the $H_2$ molecules, allowing the hydrogen ions to diffuse much more deeply in the substrate, enhancing the lifetime of the carriers in the substrate 2 and therefore also improving the conversion efficiency of the photovoltaic cell 20. This alloy layer 16 also makes it possible to enhance the quality of the silicon of the substrate 2 by the getter effect, with the impurities being trapped by a segregation mechanism. This hydrogenation phenomenon in the annealing operation is described in the document "Hydrogen passivation of defects in multicrystalline silicon solar cells" of S. Martinuzzi et al, Solar Energy Materials & Solar Cells, vol. 80, pages 343 to 353, 2003.

The diffusion of hydrogen in the substrate 2 is particularly effective when the densities of extended crystallographic defects, such as dislocations or twin boundaries, are high. The passivation by hydrogen is very useful when the concentrations of impurities, primarily metallic, are high, for example in the materials developed from low-quality fillers (metallurgical silicon fillers), or dislocation-rich materials, such as those from electromagnetic continuous casting or tape drawing.

The document "Ribbon Si solar cells with efficiencies over 18% by hydrogenation of defects", of D. S. Kim et al., Solar Energy Materials & Solar Cells, vol. 90, pages 1227 to 1240, 2006, describes an annealing of the rear face of a photovoltaic cell at a temperature between 700° C. and 800° C. in an RTP (rapid thermal processing) furnace. In the example described, the metallizations on the front face are performed by photolithography and etching of an antireflection layer, and evaporation of titanium, palladium and silver. The cell obtained offers an efficiency slightly above 18% with a P-type multicrystalline silicon substrate obtained by tape drawing, but the method proposed is not economically viable and is difficult to apply industrially.

The document "Effect of pressure on surface passivation of silicon solar cell by forming gas annealing" of S. K. Dhungel et al, Materials Science In Semiconductor Processing, vol. 7, pages 427 to 431, 2004, describes a second annealing operation performed after a first annealing of a method for producing a photovoltaic cell as described above. This second annealing operation is performed in a tube furnace comprising gas ($H_2$ and $N_2$) under pressure (3 Pa). This type of annealing is called "forming gas annealing" or FGA, and is intended in this document to incorporate hydrogen in the antireflection layer of the photovoltaic cell, so as to improve the passivation qualities of the antireflection layer—doped layer interface in the photovoltaic cell.

DESCRIPTION OF THE INVENTION

Thus there is a need to propose a method for annealing photovoltaic cells making it possible to obtain photovoltaic cells that are more efficient than the cells produced according to the methods of the prior art described above, and that are economically viable in the industry.

An embodiment of the present invention proposes a method for annealing at least one photovoltaic cell comprising a substrate based on a semiconductor, for example silicon, with a first type of conductivity, a layer doped with a second type of conductivity produced in the substrate and forming a front face of the substrate, an antireflection layer produced on the front face of the substrate and forming a front face of the photovoltaic cell, at least one metallization on the front face of the photovoltaic cell and at least on metallization on a rear face of the substrate, which method comprising at least the steps of:

a) a first annealing of the photovoltaic cell at a temperature between around 700° C. and 900° C., b) a second annealing of the photovoltaic cell at a temperature between around 200° C. and 500° C., at ambient pressure and in ambient air, with hydrogen being diffused in the substrate during the process.

By "ambient pressure", we mean here and throughout the remainder of this document a standard pressure of around 1 bar. This means that the second annealing is not performed in a chamber in which a pressure, different from the pressure of the external environment, is applied. By "ambient air", we mean here and throughout the remainder of this document that the second annealing is not performed in a chamber in which gases other than the air of the external ambient environment are present.

Thus, according to an embodiment of the invention, the photovoltaic cell undergoes at least two successive annealing steps. The first annealing operation, similarly to the methods of the prior art, enables the migration of hydrogen in ion form from the antireflection layer into the substrate if said antireflection layer is hydrogen-rich. The hydrogen diffused in the substrate can also be obtained by a step of hydrogenation of the substrate. The second annealing operation, which is performed at a much lower temperature than the first annealing operation, enables the diffused hydrogen to form additional bonds with crystallographic defects or impurities present in the substrate. Thus, the lifetime of the carriers in the substrate is prolonged, thus enhancing the efficiency of the photovoltaic conversion of the cell. In addition, this second annealing operation does not require any pressure or gas constraints, unlike the annealing operations under $H_2$ and $N_2$ of the prior art, which represents a significant economic advantage.

The objective of the second annealing operation is primarily to enhance the volumetric properties of the substrate by promoting the formation of bonds between the hydrogen present in the substrate and the crystallographic defects or impurities.

This method is therefore particularly suitable for producing photovoltaic cells comprising substrates obtained from fillers of lower quality and dislocation-rich materials, for example the silicon from electromagnetic continuous casting or tape drawing.

Another embodiment relates to a method for producing at least one photovoltaic cell, comprising at least the steps of:
   texturising the surfaces of a substrate based on a semiconductor, for example silicon, with a first type of conductivity,
   forming a layer doped with a second type of conductivity in the substrate forming a front face of the substrate,
   depositing an antireflection layer on the front face of the substrate, which layer forms a front face of the photovoltaic cell,
   producing at least one metallization on the front face of the photovoltaic cell,
   producing at least one metallization on a rear face of the substrate,
   implementing an annealing method as described above, which is also an object of this invention,
   removing at least a portion of the layer doped with the second type of conductivity electrically connecting or coupling the metallization of the front face to the metallization of the rear face of the photovoltaic cell.

BRIEF DESCRIPTION OF THE DRAWINGS

This invention can be better understood on reading the following description of example embodiments provided purely as a non-limiting indication, in reference to the appended drawings, in which.

Identical, similar or equivalent parts of the different figures described below have the same numeric references for the sake of consistency between the figures.

The different parts shown in the figures are not necessarily shown according to a uniform scale, so as to make the figures easier to read.

The various possibilities (alternatives and embodiments) must be understood as not being mutually exclusive and can be combined with one another.

DETAILED DESCRIPTION OF SPECIFIC EMBODIMENTS

Figure 1A:
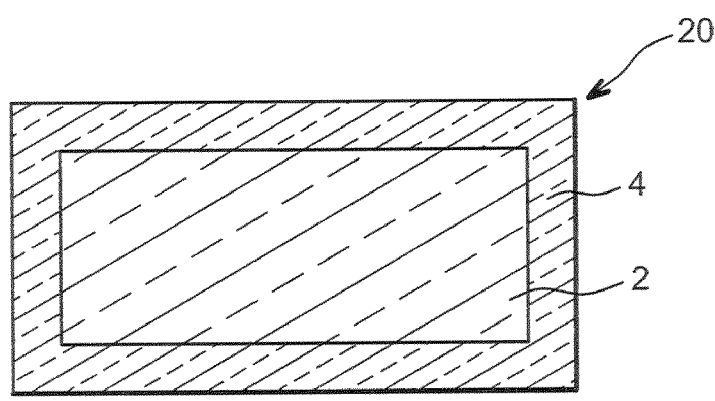
FIGS. 1A to 1E described above show the steps of a method for producing a photovoltaic cell according to the prior art.
Figure 1B:
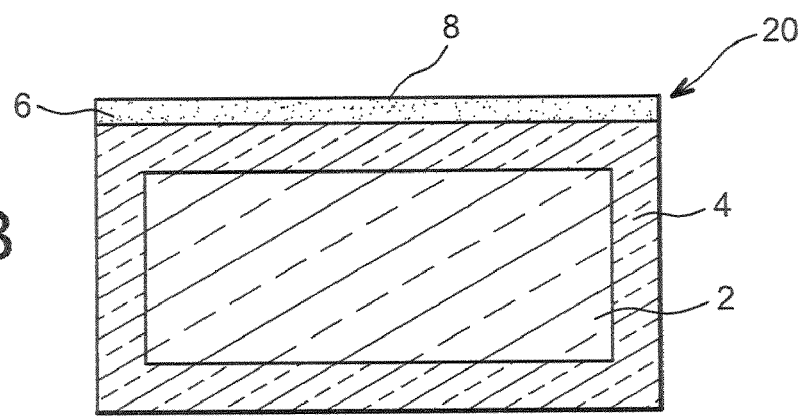
Figure 1C:
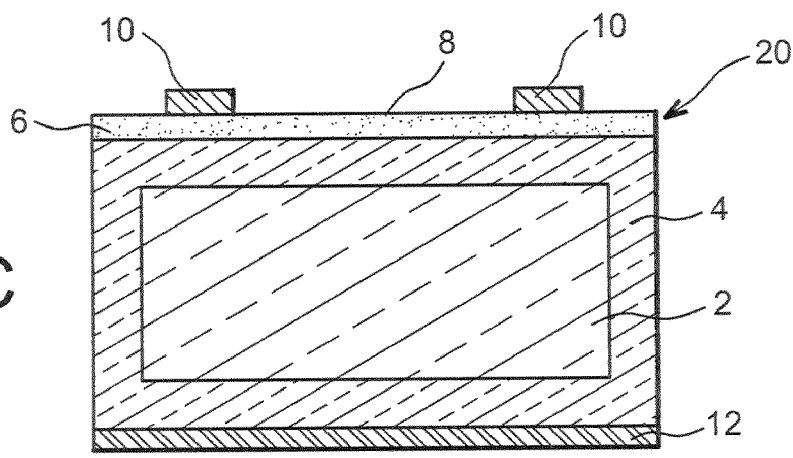
Figure 1D:
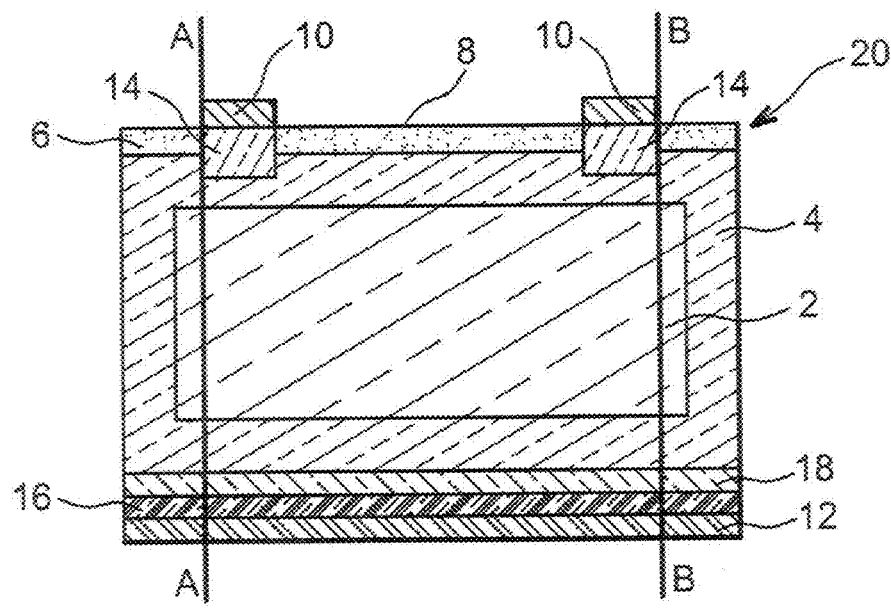
Figure 1E:
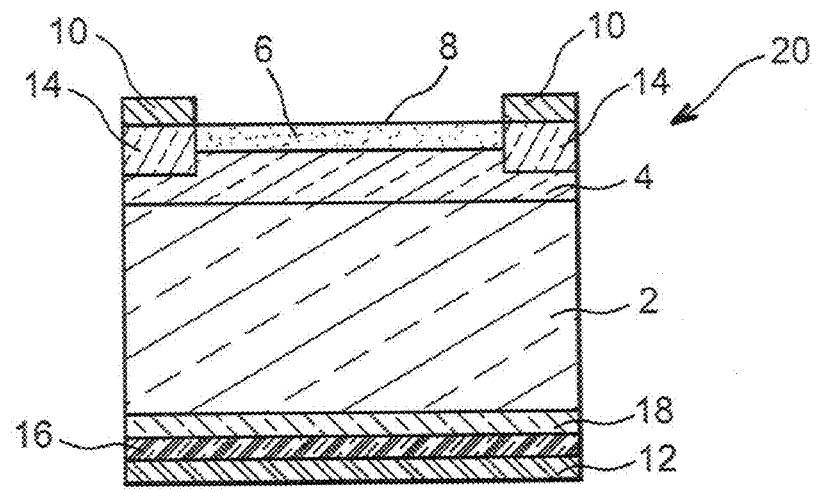
Figure 2A:
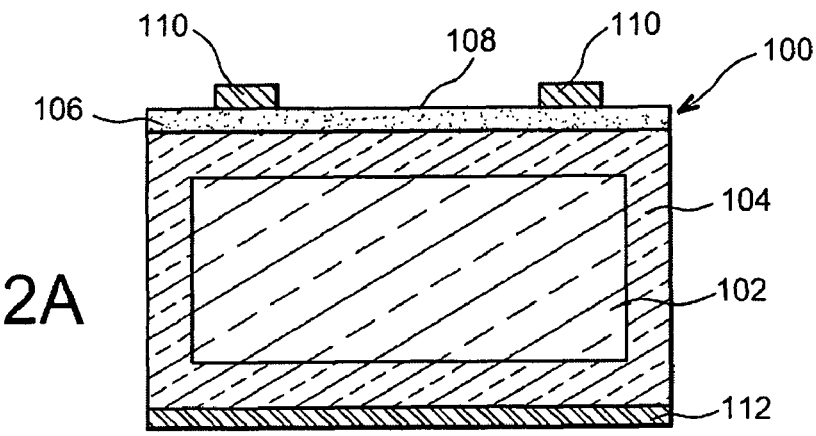
FIGS. 2A to 2C show the steps of a method for annealing a photovoltaic cell according to an embodiment of the invention.
Figure 2B:
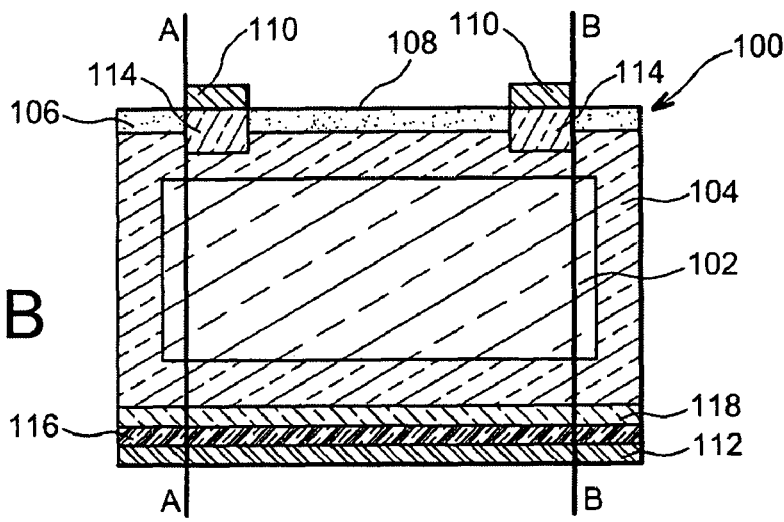
Figure 2C:
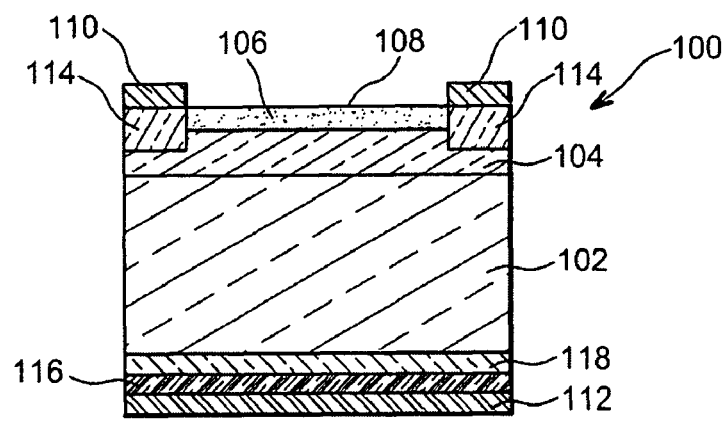

We will refer to FIGS. 2A to 2C, which show the steps of a method for annealing a photovoltaic cell 100. The steps of a method for producing the photovoltaic cell 100 will also be described in association with these figures.

A substrate 102 with a first type of conductivity, for example based on P-type multicrystalline or monocrystalline silicon, is shown in FIG. 2A. To produce the photovoltaic cell 100, the surfaces of the substrate 2 are first texturised using a potassium hydroxide solution. A layer 104 doped with a second type of conductivity, for example of the N+ type, is then formed by diffusion of phosphorus in the substrate 102. This layer 104 in particular forms a front face of the substrate 102 on which, for example by PECVD, an antireflection layer 106 is deposited, which layer is for example rich in hydrogen and based on silicon nitride or silicon carbide, and forms a front face 108 of the photovoltaic cell 100. The PN junction of the photovoltaic cell 100 is formed by the P-type substrate 102 and the N+ layer 104.

During the process of annealing the photovoltaic cell 100, hydrogen is diffused in the substrate 102. This hydrogen can, for example, come from the antireflection layer 106 when it is rich in hydrogen. This hydrogen can also be present in the substrate 102 after a step of hydrogenation of the substrate 102, for example by plasma, implemented during the process. This step can be performed for example before and/or after the deposition of the antireflection layer 106.

As shown in FIG. 2A, metallizations 110, for example based on silver, are produced for example by serigraphy on the front face 108 of the photovoltaic cell 100. The metallizations 110 can also be based on at least one metal other than silver, and formed by other techniques such as photolithography or printing. A metallization layer 112, for example based on aluminum, is produced on the rear face of the substrate 102. This metallization layer 112 can, for example, be produced by serigraphy, or by photolithography or printing.

The solar cell 100 is then placed for example in an infrared passage furnace in order to undergo a first annealing operation, as shown in FIG. 2B. This first annealing operation is performed at a temperature between around 700° C. and 900° C., thus forming contacts 114 between the metallizations 110 and the N+ layer 104, a P+ doped layer 118 in the substrate 102 and a layer 116 based on an aluminum and silicon alloy, replacing the N+ layer 104 under the metallization layer 112. For P-type substrates, the P+ doped layer 118 performs the passivation of the rear face of the substrate 102 by a back-surface field effect (BSF) pushing minority carriers into the substrate 102. In this first annealing operation, hydrogen migrates in the form of ions from the hydrogen-rich antireflection layer 106 into the substrate 102, performing a passivation of the crystallographic defects and impurities of the substrate 102. This first annealing operation can also be performed in a conventional annealing furnace, or by other known annealing techniques. This first annealing operation is preferably performed at a temperature between around 800°

C. and 900° C. for a period of between around 1 second and 10 seconds, allowing for better contact between the metallizations 110 and the N+ doped area 104.

The photovoltaic cell 100 then undergoes a second annealing operation, for example in an infrared passage furnace, at a temperature between around 200° C. and 500° C. This annealing operation does not deteriorate the metallizations 110 and 112 and enables the formation of hydrogen—impurity or hydrogen—crystallographic defect bonds. These bonds make it possible to enhance the lifetime of the carriers of the substrate, and therefore to enhance the efficiency of the photovoltaic conversion of the cell 100.

The following table presents measurements of photovoltaic parameters (Vco: open circuit voltage; Jcc: short-circuit current; AR: aspect ratio; η: conversion efficiency) of three photovoltaic cells each comprising a substrate based on multicrystalline silicon developed from fillers of metallurgical quality, produced between the first annealing operation and the second annealing operation, and after the second annealing operation. For these three cells, the second annealing operation is performed at a temperature of around 300° C.

|  | Before the second annealing operation | After the second annealing operation |
| --- | --- | --- |
| 1st cell | Vco = 602 mV<br>Jcc = 28.4 mA/cm$^2$<br>AR = 62.8%<br>η = 10.74% | Vco = 604 mV<br>Jcc = 28.9 mA/cm$^2$<br>AR = 63.02%<br>η = 11.1% |
| 2nd cell | Vco = 603 mV<br>Jcc = 28.63 mA/cm$^2$<br>AR = 62.1%<br>η = 10.73% | Vco = 606 mV<br>Jcc = 29.1 mA/cm$^2$<br>AR = 64%<br>η = 11.3% |
| 3rd cell | Vco = 604 mV<br>Jcc = 28.51 mA/cm$^2$<br>AR = 62.3%<br>η = 10.8% | Vco = 605 mV<br>Jcc = 29.2 mA/cm$^2$<br>AR = 63.3%<br>η = 11.2% |

It is observed for these 3 cells that a mean increase of 0.44% in the conversion efficiency is obtained by the second annealing operation performed during an annealing process.

This second annealing operation can also be performed in a conventional furnace, or by other known annealing techniques, at ambient pressure and in ambient air. This second annealing operation is preferably performed at a temperature around equal to 300° C., for a period of between around 10 seconds and 2 minutes, making it possible to enhance the metallic diffusion of the metallizations 110.

Finally, as shown in FIG. 2C, the portions of the N+ layer 104 connecting or coupling the layer 118 and the contacts 114, i.e. electrically connecting or coupling the metallizations 110 of the front face to the metallization layer 112 of the rear face, are removed. In FIG. 2C, all of the elements of the photovoltaic cell 100 located on the external side of planes AA and BB are removed, for example by laser, plasma, coating or any other etching means.

This second annealing operation can also be implemented during a method for producing a photovoltaic cell comprising the production steps described above. It is possible for the photovoltaic cell to undergo more than two annealing operations, with the second annealing operation cited above becoming for example a third or a fourth annealing operation. For example, a first annealing operation can be performed after the formation of the metallizations on the front face of the photovoltaic cell and a second annealing operation can be performed after the formation of metallizations on the rear face of the substrate.

The method according to an embodiment of the invention is also particularly suitable for the production of photovoltaic cells comprising N-type substrates. In this case, the P+ doped layer 118 acts as an emitter of the PN junction of the photovoltaic cell. The N+ doped layer 104 then performs the passivation of the front face of the substrate 102 by a front-surface field effect (FSF) pushing minority carriers into the substrate 102, with the antireflection layer 106 also contributing to this passivation. It is also possible for the layer doped with the second type of conductivity 104 to be a P+ doped layer, obtained for example by diffusion of boron in the substrate 102.

The invention claimed is:

1. Method for annealing at least one photovoltaic cell comprising a substrate based on silicon with a first type of conductivity, a layer doped with a second type of conductivity produced in the substrate and forming a front face of the substrate, an antireflection layer produced on the front face of the substrate and forming a front face of the photovoltaic cell, at least one metallization on the front face of the photovoltaic cell and at least on metallization on a rear face of the substrate, which method comprising at least the steps of:
   a) a first annealing of the photovoltaic cell at a temperature between around 700° C. and 900° C.,
   b) a successive second annealing of the photovoltaic cell at a temperature between around 200° C. and 500° C., at ambient pressure and in ambient air, and performed during a period of between around 10 seconds and 2 minutes,
   with hydrogen being diffused in the substrate during the process.

2. Method according to claim 1, the antireflection layer being rich in hydrogen.

3. Method according to claim 1, the hydrogen diffused in the substrate being obtained by a step of hydrogenation of the substrate.

4. Method according to claim 1, the first and/or the second annealing operation being performed in an infrared passage furnace.

5. Method according to claim 1, the layer doped with the second type of conductivity being an N+ doped layer.

6. Method according to claim 1, the antireflection layer being based on silicon nitride.

7. Method according to claim 1, the substrate being a substrate based on multicrystalline silicon.

8. Method according to claim 1, the metallization produced on the front face of the photovoltaic cell being based on silver.

9. Method according to claim 1, the metallization produced on the rear face of the substrate being based on aluminum.

10. Method according to claim 1, the metallization on the front face and/or the metallization on the rear face being performed by serigraphy.

11. Method for producing at least one photovoltaic cell, comprising at least the steps of:
   texturising the surfaces of a substrate based on silicon with a first type of conductivity,
   forming a layer doped with a second type of conductivity in the substrate forming a front face of the substrate,
   depositing an antireflection layer on the front face of the substrate, which layer forms a front face of the photovoltaic cell,
   producing at least one metallization on the front face of the photovoltaic cell,
   producing at least one metallization on a rear face of the substrate,
   implementing an annealing method according to claim 1, removing at least a portion of the layer doped with the second type of conductivity electrically coupling the metallization of the front face to the metallization of the rear face of the photovoltaic cell.

12. Method according to claim 11, when the hydrogen diffused in the substrate is obtained from a step of hydrogenation of the substrate, said hydrogenation step being performed before and/or after the deposition of the antireflection layer.

13. Method according to claim 11, the texturisation step being performed with a potassium hydroxide-based solution.

14. Method according to claim 11, the layer doped with a second type of conductivity being an N+ layer formed by the diffusion of phosphorus in the substrate.

15. Method according to claim 11, the antireflection layer being a silicon nitride-based layer deposited by PECVD.

16. Method according to claim 1, wherein the first annealing is performed during a period of between around 1 second and 10 seconds.

* * * * *

UNITED STATES PATENT AND TRADEMARK OFFICE
CERTIFICATE OF CORRECTION

| | |
|---|---|
| PATENT NO. | : 7,935,562 B2 |
| APPLICATION NO. | : 11/845841 |
| DATED | : May 3, 2011 |
| INVENTOR(S) | : Nicolas Enjalbert and Sebastien Dubois |

It is certified that error appears in the above-identified patent and that said Letters Patent is hereby corrected as shown below:

On title page, Item (75) INVENTORS, please delete "Sebastein" and insert therefor --Sebastien--.

Signed and Sealed this
Fifth Day of July, 2011

David J. Kappos
*Director of the United States Patent and Trademark Office*